United States Patent [19]
Tango et al.

[11] 4,080,618
[45] Mar. 21, 1978

[54] INSULATED-GATE FIELD-EFFECT TRANSISTOR

[75] Inventors: Hiroyuki Tango; Tadahiro Takigawa, both of Yokohama, Japan

[73] Assignee: Tokyo Shibaura Electric Co., Ltd., Tokyo, Japan

[21] Appl. No.: 720,804

[22] Filed: Sep. 7, 1976

[30] Foreign Application Priority Data

Sep. 5, 1975 Japan .................................. 50-107782

[51] Int. Cl.² .................... H01L 29/78; H01L 27/02; H01L 23/48
[52] U.S. Cl. ......................... 357/23; 357/41; 357/51; 357/68; 357/89
[58] Field of Search ....................... 357/23, 41, 51, 68, 357/89

[56] References Cited

U.S. PATENT DOCUMENTS

| 3,959,025 | 5/1976 | Polinsky | 357/23 |
| 3,986,903 | 10/1976 | Watrous | 357/23 |

Primary Examiner—Edward J. Wojciechowicz
Attorney, Agent, or Firm—Oblon, Fisher, Spivak, McClelland & Maier

[57] ABSTRACT

An insulated-gate field-effect transistor having improved high-speed operation characteristics and high channel controllability includes a source region having first and second diffused regions and a drain region having first and second diffused regions. The first diffused regions of both the source and drain regions are formed by diffusion of a first impurity having relatively low diffusion coefficient and the second diffused regions of both the source and drain regions are formed by diffusion of a second impurity having relatively high diffusion coefficient.

1 Claim, 16 Drawing Figures

INSULATED-GATE FIELD-EFFECT TRANSISTOR

BACKGROUND OF THE INVENTION

1. Field of the Invention:

This invention relates generally to an insulated-gate field-effect transistor, and more particularly, to an insulated-gate field-effect transistor in which a source region is formed by diffusion of two kinds of impurities and a drain region is also formed by diffusion of two kinds of impurities, the two kinds of impurities having different diffusion depths.

2. Description of the Prior Art

In the conventional n-type channel insulated-gate field-effect transistor, for example, the n-type channel metal oxide semiconductor field-effect transistor (MOSFET), thermal diffusion of phosphorus is used in order to form n-type source and drain regions in a p-type silicon substrate.

However, if it is desired that the channel length should be shortened to 5 $\mu$m, for example, in order to produce a MOSFET having a highspeed of operation, control of the channel length is very difficult, because diffusion of phosphorus in the horizontal direction may not be ignored. As a result thereof, punch-through between source and drain regions is apt to occur, and consequently it is difficult to produce a MOSFET having high-reproducibility and a uniform characteristics.

On the other hand, arsenic, which can be diffused into a silicon substrate to form an n-type conductive layer in the same manner as phosphorus, has a low diffusion coefficient in comparison to that of phosphorus, and creates less crystal distortion because its atomic radius is similar to that of silicon. Furthermore, the concentration gradient of arsenic in the diffused layer of arsenic is steep, and therefore diffusion of arsenic in the horizontal direction is small; and the diffusion concentration profile is not easily changed in the heat treatment steps after diffusion because arsenic does not diffuse readily at the normal heat treatment temperature. Accordingly, it can be said that arsenic is a superior impurity which can improve the accuracy of diffusion control.

However, it is difficult to diffuse arsenic at high concentrations into a silicon substrate under the most suitable conditions for forming the MOSFET, and also difficult to diffuse arsenic into the substrate with the desirable depth. In accordance with our studies, for an arsenic-glass layer of 2,000 Å thick (arsenic concentration : 6 × $10^{21}$/cm$^3$) deposited on a silicon substrate and diffused into the silicon substrate at the temperature of 1,000° C for 30 minutes, the surface resistance $\rho_s$ of the n-type layer obtained by the above-mentioned treatment was 50 $\Omega/\square$, and the depth of diffusion was 0.2 $\mu$m.

Consequently, it is difficult to lower the surface resistance sufficiently even though the source region and the drain region are formed by the diffusion of arsenic. Therefore, even though the channel length is sufficiently reduced, it is difficult to secure the speed-up of operation of the MOSFET. Moreover, since the depth of the diffused region of arsenic is shallow, diffused aluminum used as electrodes can push through the source or drain region, and as a result abnormal leakage current can flow.

SUMMARY OF THE INVENTION

Accordingly, it is an object of the present invention to provide a new and improved insulated-gate field-effect transistor, and in particular to provide a new and improved insulated-gate field-effect transistor in which high-speed operation is obtained with a short length of channel.

Another object of the present invention is to provide a new and improved insulated-gate field-effect transistor in which a high-reliability is obtained.

According to the present invention, the foregoing and other objects are attained by the provision of an insulated-gate field-effect transistor comprising a semiconductor substrate of one conductivity type, source and drain regions of the opposite conductivity type formed in the semiconductor substrate, the source and drain regions respectively being formed with a relatively shallow diffused region and a relatively deep diffused region, the shallow diffused regions in the source and drain regions being formed by the diffusion and an impurity having relatively low diffusion coefficient as compared to that of an impurity being diffused into the deep diffused region in the source and drain regions, the shallow diffused regions of the source and drain regions being adjacent to a channel region, a gate-insulation film formed on the surface of the substrate between source and drain regions, a gate electrode formed on the gate-insulation film, an insulation film formed on the gate electrode and on the shallow diffused regions in the source and drain regions, a source electrode formed on the deep diffused region in the source region, and a drain electrode formed on the deep diffused region in the drain region.

Briefly, in accordance with the present invention, a first impurity having low diffusion coefficient is shallowly doped into the parts of the source and drain regions which are adjacent to the channel region while a second impurity having a higher diffusion coefficient than that of the first impurity is deeply doped into the remaining parts of the source and drain regions.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF THE PREFERRED EMBODIMENTS

Figure 1A:
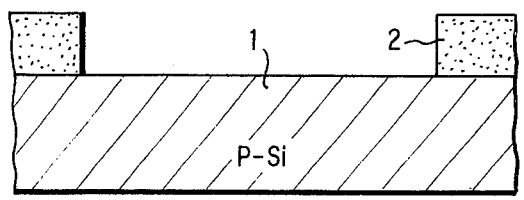
FIGS. 1a through 1g are sectional views showing an insulated-gate field-effect transistor according to an embodiment of the present invention at each step of the manufacturing process.
Figure 1B:
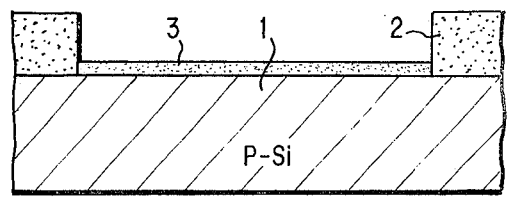
Figure 1C:
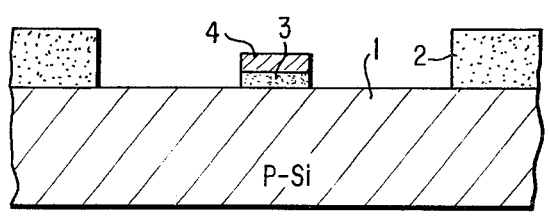
Figure 1D:
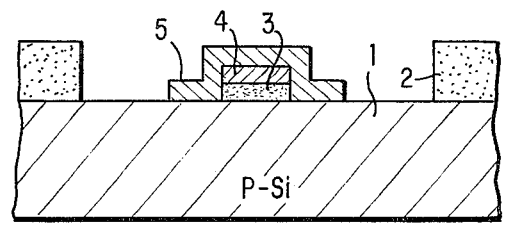
Figure 1E:
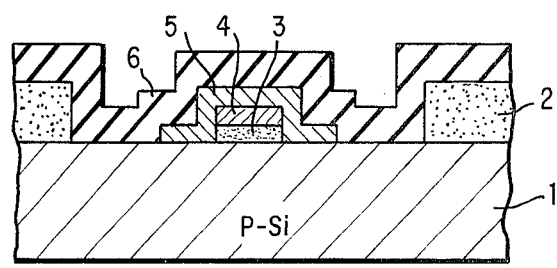
Figure 1F:
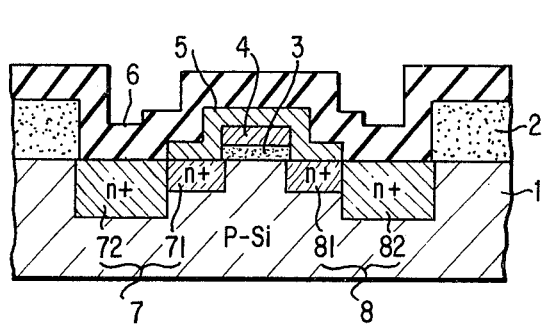
Figure 1G:
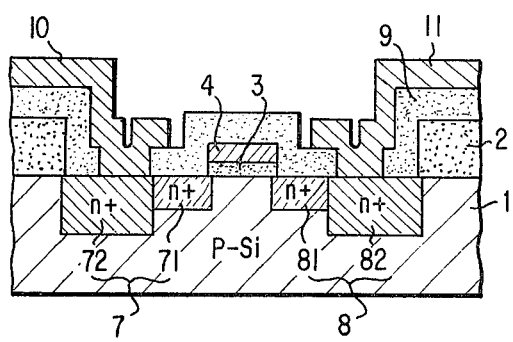

Referring now to the drawings, wherein like reference numerals designate identical or corresponding parts throughout the several views, and more particularly to FIG. 1 thereof, the steps of forming the preferred embodiment of the present invention are illustrated in FIGS. 1a and 1g.

In this embodiment, arsenic is used as the first impurity having a low diffusion coefficient, and phosphorus is used as the second impurity having a high diffusion coefficient, in order to form a n-type channel MOSFET.

First, a p-type silicon substrate 1 having an acceptor concentration of $1 \times 10^{16}/cm^3$, is provided. Then the p-type silicon substrate 1 is heated at a temperature of 1,100° C for about 260 minutes in an oxygen atmosphere including 5% hydrochloric acid. As a result thereof, a silicon dioxide (SiO$_2$) layer 2 about 8,000 Å thick is formed on the entire surface of the silicon substrate 1. Then, the silicon dioxide layer 2 is partly removed by the well-known photo-etching technique so that a transistor region is provided. (FIG. 1a).

Subsequently, a gate-insulation film (silicon dioxide layer) 3 about 1,000 Å thick is formed on the surface of the silicon substrate 1 by the well-known heat oxidation technique. (FIG. 1b).

At the next step, a polycrystalline silicone layer about 3,000 Å thick, in which phosphorus is doped, is formed on the entire surface of the slicon dioxide layer 3, utilizing the thermal decomposition of silane (SiH$_4$). Then, this 3,000 Å thick silicon dioxide layer is partly etched by photo-etching so that a silicon dioxide layer approximately 4 μm wide is left. After that, a silicon gate electrode 4 is formed by etching the polycrystalline silicon layer, using the 4 μm wide silicon dioxide layer as a mask. (FIG. 1c).

Subsequently, an arsenic-glass layer 5 is deposited on the silicon gate electrode 4 and on the surface of the silicon substrate 1. Then the arsenic-glass layer is removed by the photo-etching technique except for a 4 μm wide portion on electrode 4 and except for 4 μm wide portions on the surface of the silicon substrate 1 on both sides of the gate electrode 4. (FIG. 1d).

After that, a phosphorus-glass layer 6 about 6,000 Å thick is deposited on the arsenic-glass layer 5 and on the surface of the silicon substrate 1. (FIG. 1e).

Next, the structure shown in FIG. 1e is heated at a temperature of 1,050° C for 15 minutes. As a result thereof, arsenic is diffused from the arsenic-glass layer 5 into the silicon substrate 1 so that first source region 71 and first drain region 81 are formed, and at the same time, phosphorus is diffused from the phosphorus-glass layer 6 into the silicon substrate 1 so that second source region 72 and second drain region 82 are formed. (FIG. 1f). Accordingly, a shallow n$^+$-type arsenic diffused region 71 and a deep n$^+$-type phosphorus diffused region 72 which is electrically connected to the region 71, are formed simultaneously as a source region 7; and a shallow n$^+$-type arsenic diffused region 81 and a deep n$^+$-type phosphorus diffused region 82 which is electrically connected to the region 81, are formed simultaneously as a drain region 8.

At the next step, the arsenic-glass layer 5 and the phosphorus-glass layer 6 are removed by etching and a new insulation film (oxidizing film) 9 is deposited on the gate electrode 4 and on the surface of the silicon substrate 1 by the well-known chemical evaporation technique. After openings are formed on the surface of each of n$^+$-type phosphorus diffused regions 72 and 82, aluminum is deposited into each opening so that a source electrode 10 and a drain electrode 11 are formed. (FIG. 1g).

At the last step, the structue shown in FIG. 1g is treated in forming gas (90% of N$_2$ and 10% of H$_2$) at a temperature of 500° C for 15 minutes so that the n-type channel MOSFET of the present invention is completed.

As described above, in the insulated-gate field-effect transistor of the present invention, the regions 71 and 81 of the source and drain regions 7 and 8, which are adjacent to the channel region, are respectively formed by shallow diffused layers of arsenic having a low diffusion coefficient. Therefore, diffusion of arsenic from the regions 71 and 81 in the horizontal direction is small and, as a result thereof, it is easy to control the channel length. Consequently, in the MOSFET of the present invention there is little danger of punch-through between the source and drain regions 7 and 8 even though the channel length is desirably shortened.

Moreover, in the MOSFET of the present invention, the regions 72 and 82 of the source and drain regions 7 and 8 are respectively formed from a deep diffused layer of phosphorus having a high diffusion coefficient. Therefore, it is difficult for aluminum formed on the regions 72 and 82 to push through the regions 72 and 82, and therefore, abnormal leakage currents can be prevented.

Furthermore, according to the MOSFET of the present invention, it is easy to keep a low surface resistance because of the existence of the regions 72 and 82 which are deep diffused regions of phosphorus. Therefore, in connection with the fact that it is easy to shorten the channel length as mentioned above, the speeding up of the transistor operation can be obtained.

Obviously, the way to form the MOSFET of the present invention is not limited to the manufacturing process shown in FIGS. 1a through 1g. That is to say, for example, the order of two steps shown in FIGS. 1d and 1e can be reversed.

Figure 2A:
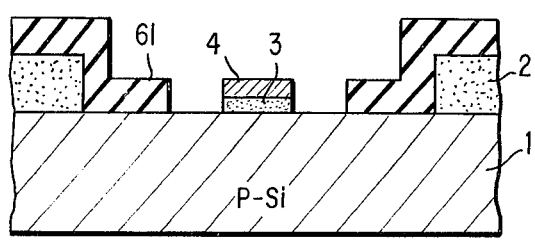
FIGS. 2a and 2b are sectional views showing the insulated-gate field-effect transistor according to the present invention in other steps substitutable for the steps shown in FIGS. 1d and 1e; and, FIGS. 3a and 3g are sectional views showing the insulated-gate field-effect transistor of the present invention in an integrated circuit, at each step of the manufacturing process.
Figure 2B:
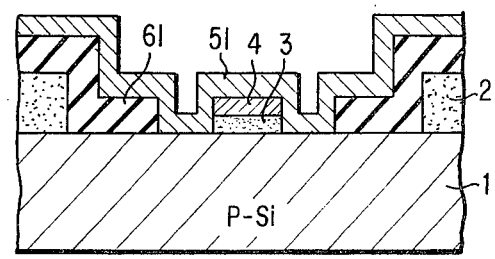

FIGS. 2a and 2b show the above-mentioned alternative steps.

Namely, as a first step, a phosphorus-glass layer is deposited on the gate electrode 4 and on the surface of the silicon substrate 1, and then a 4 μm wide portion of the phosphorus-glass layer on the gate electrode 4 and 4 μm wide portions on the surface of the silicon substrate 1 of both sides of the gate electrode 4, are removed by etching so that the prescribed portion of the phosphorus-glass layer 61 remains. (FIG. 2a).

As the next step, an arsenic-glass layer 51 is deposited on the entire surface. (FIG. 2b).

After that, the structure shown in FIG. 2b is heated so that phosphorus and arsenic are diffused into the silicon substrate 1. As a result thereof, the source region 7 and the drain region 8, which are the same as that shown in FIG. 1f, are obtained.

FIGS. 3a through 3g show the formation steps of the MOSFET of the present invention in an integrated circuit.

Since the steps shown in FIGS. 3a, 3b, 3c and 3d are the same as those shown in FIGS. 1a, 1b, 1c and 1d, the detailed description regarding these steps will be omitted.

Figure 3A:
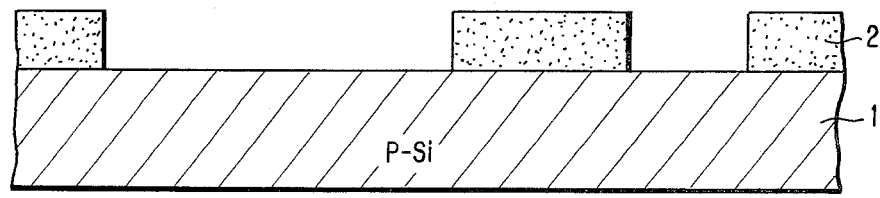
Figure 3B:
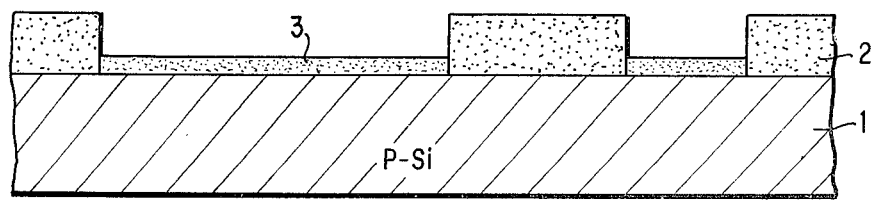
Figure 3C:
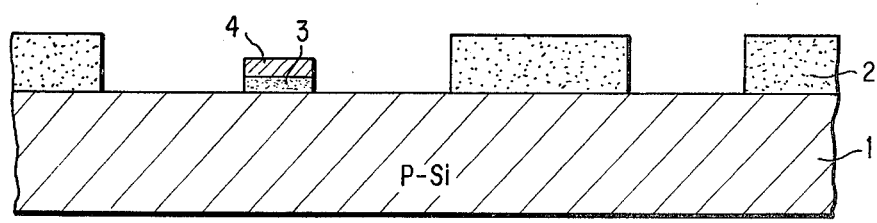
Figure 3D:
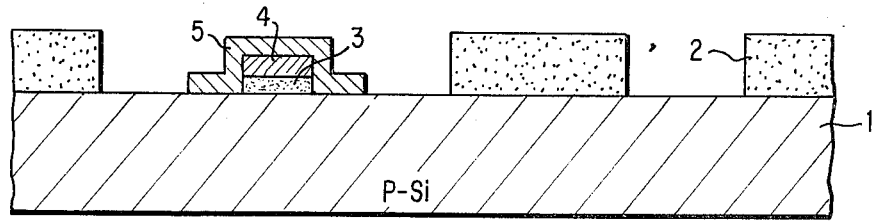
Figure 3E:
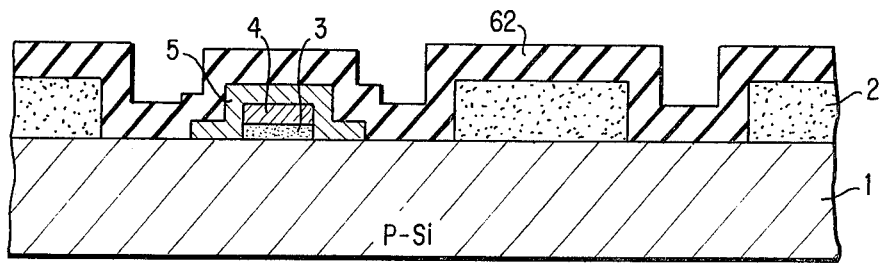

Referring now to FIG. 3e, a phosphorus-glass layer 62 of about 6,000 Å thick is deposited not only on the transistor region but also on a wiring region.

Figure 3F:
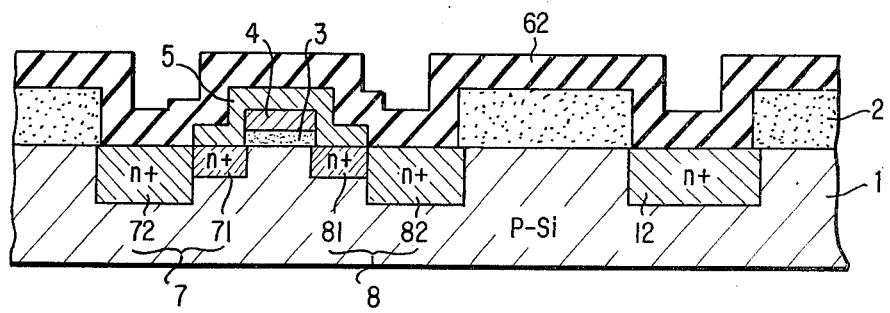

Then, the structure shown in FIG. 3e is heated at a temperature of 1,050° C for 15 minutes. As a result thereof, arsenic is diffused from the arsenic-glass layer 5 into the silicon substrate 1 so that the first source region 71 and the first drain region 81 are formed and, simultaneously, phosphorus is diffused from the phosphorus-glass layer 62 into the silicon substrate 1 so that the second source region 72, the second drain region 82 and a wiring region 12 are formed. (FIG. 3f).

Figure 3G:
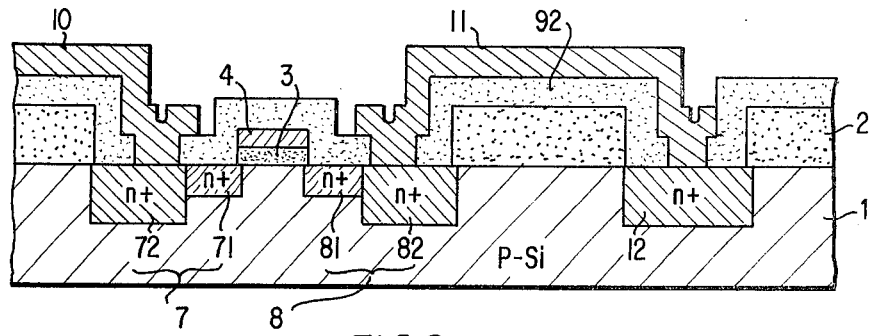

Subsequently, the arsenic-glass layer 5 and the phosphorus-glass layer 62 are removed by etching, and a new oxidizing film 92 is deposited on the entire surface. After openings are formed on the surface of each of $n^+$-type phosphorus diffused regions 72 and 82 and on the surface of the wiring region 12, aluminum is deposited into each opening so that the source electrode 10 and the drain electrode 11 which is electrically connected to the wiring region 12, are formed. (FIG. 3g).

According to this embodiment, the wiring region 12 is formed at the same time as the $n^+$-type phosphorus diffused regions 72 and 82, and furthermore, the drain electrode 11 can be connected to the wiring region 12 by and in only one step. Therefore, it can be easily understood that the surface resistance of the wiring region can be reduced enough so that it is possible to make a MOSFET integrated circuit having a high integration rate and high-speed operation characteristics.

In the above-mentioned embodiments, arsenic was used as the first impurity having low diffusion coefficient. However, antimony or bismuth can be used for the same purpose.

Moreover, the present invention was described in connection with the formation of the n-type channel MOSFET. However, it will be understood by anyone of ordinary skill in the art that the process and resulting structure will be equally applicable to a p-type channel MOSFET except for a variation in type conductivity and dopant materials. Namely, in p-type channel MOSFET, gallium, indium or thallium can be used as the first impurity which has low diffusion coefficient and is doped into the silicon substrate adjacent to the channel region, and boron or aluminum can be used as the second impurity which has high diffusion coefficient and is doped into another part of the silicon substrate.

Furthermore, the present invention was described in connection with the formation of a silicon gate MOSFET. However, it will be easily understood that this invention will be equally applicable to an FET having other kinds of gate constructions, an iron gate or a silicide gate, for example.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. In an integrated circuit including a semiconductor substrate of one conductivity type having a wiring region of the opposite conductivity type, an insulated-gate field-effect transistor comprising:
    source and drain regions of the opposite conductivity type formed in said semiconductor substrate, said source and drain regions respectively being formed with a relatively shallow diffused region and a relatively deep diffused region, said shallow diffused regions in said source and drain regions being formed by the diffusion of first impurity having a relatively low diffusion coefficient compared to that of a second impurity diffused into said deep diffused regions in said course and drain regions, said shallow diffused regions in said source and drain regions being adjacent to a channel region;
    a gate-insulation film formed on the surface of said semiconductor substrate between said source region and said drain region;
    a gate electrode formed on said gate-insulation film;
    an insulation film formed on said gate electrode and on said shallow diffused regions in said source and drain regions;
    a source electrode formed on said deep diffused region in said source region;
    a drain electrode formed on said deep diffused region in said drain region and connected to said wiring region; and,
    wherein said wiring region is a diffused region relatively deeper than said shallow diffused regions in said source and drain regions.

* * * * *